United States Patent
Jeng

(10) Patent No.: US 6,455,440 B1
(45) Date of Patent: Sep. 24, 2002

(54) METHOD FOR PREVENTING POLYSILICON STRINGER IN MEMORY DEVICE

(75) Inventor: Pei-Ren Jeng, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/903,668

(22) Filed: Jul. 13, 2001

(51) Int. Cl.$^7$ .................. H01L 21/469; H01L 21/31
(52) U.S. Cl. ...................... 438/770; 438/911
(58) Field of Search ................. 438/197, 201, 438/257, 220, 504, 510, 488, 494, 663, 668, 706, 770, 709, 733, 738, 745, 689, 911

(56) References Cited

U.S. PATENT DOCUMENTS

| | | | | |
|---|---|---|---|---|
| 5,427,967 A | * | 6/1995 | Sadjadi et al. | 438/257 |
| 5,705,419 A | * | 1/1998 | Perry et al. | 438/588 |
| 5,846,861 A | * | 12/1998 | Saitoh | 438/258 |
| 6,110,833 A | * | 8/2000 | Early et al. | 438/700 |
| 6,146,946 A | * | 11/2000 | Wang et al. | 438/264 |
| 6,271,143 B1 | * | 8/2001 | Mendicino | 438/700 |

* cited by examiner

*Primary Examiner*—Hoai Ho
*Assistant Examiner*—David Nhu

(57) ABSTRACT

In accordance with the present invention, a method for preventing polysilicon stringers in memory devices is disclosed. The key aspect of the present invention is the formation of a floating gate structure with multi-level oxidation rates the lower portion of the floating gate structure the higher oxidation rate, such as a floating gate structure with two polysilicon layers of different doping concentration or crystallinity the lower polysilicon layer the higher doping concentration, or the lower polysilicon layer the higher crystallinity. Therefore, in a later oxidation process a desired profile of the floating gate structure for etch process defining word lines is formed, that is from lower portion to higher portion of the floating gate structure an increasing width profile is formed. The width of the upper portion of the floating gate structure is bigger than that of the lower portion of the floating gate structure. Thus, the anisotropic etching process of isolating the word lines maintains an ideal etching result, in other words, the polysilicon stringers in the etched region which short out the word lines is eliminated.

11 Claims, 6 Drawing Sheets

METHOD FOR PREVENTING POLYSILICON STRINGER IN MEMORY DEVICE

BACKGROUND OF THE INVENTION

1. Field of the Invention

The present invention generally relates to a method for preventing stringers in memory devices, and more particularly to a method for preventing polysilicon stringers in memory devices with flat cells by forming a floating gate structure with multi-level oxidation rates.

2. Description of the Prior Art

A memory device for storing data has a great significance in a data processing system. Memory devices, such as random access memory (RAM), read-only memory (ROM), and the like, are known in the art. Non-volatile memory devices, and particularly so-called "flash" memory devices, have become increasingly more popular in data storage applications. Generally, an array of flash memory cells may be formed on a semiconductor substrate in a series of rows and columns, accessed by conductors referred to as word lines and bit lines. FIG. 1 illustrates a top view of a portion of an array 10. FIG. 2 is a cross-sectional view taken along a cutting line 2—2 in FIG. 1. Typically, the layout of a flash memory array is shown as FIG. 1, and the cross-sectional structure of a flash memory cell is depicted in FIG. 2.

Referring to FIG. 1 and FIG. 2, each memory cell 100 is formed in the semiconductor substrate 101 by, for example, formation of source 110 and drain 112 regions with a channel region position between the drain 112 and source 110 regions. A tunnel oxide layer 114 or gate dielectric layer (not shown in FIG. 1) is formed on the substrate 101 separating a first polysilicon layer or floating gate layer 116 from the source 110 and drain 112 regions. The control gates of the respective cells that are formed in a lateral row share a common word line (WL) 120 associated with the row of cells. That is to say, a second polysilicon layer or control gate layer 120 is formed over the floating gate layer 116 separated by an interpoly dielectric layer 118 (not shown in FIG. 1) such as oxide-nitride-oxide (ONO) sandwich. Field oxide regions 102 separate and isolate adjacent memory devices along a word line 120. Additionally, for the purpose of improving the coupling ratio, an extra polysilicon layer 124 is formed between the floating gate layer 116 and the interpoly dielectric layer 118 to enhance the surface area of the floating gate, wherein adjacent floating gate layers 116 is isolated by a dielectric layer 122, as shown in FIG. 3A.

FIG. 3A is a cross-sectional view of a cell with enhanced floating gate structure similar to that taken along a cutting line 3—3 in FIG. 1. That is an extra polysilicon layer is formed on the floating gate layer in the process of forming a memory cell similar to that in FIG. 1. A first polysilicon layer 116 (first floating gate layer) in strip shape is formed between two field oxide regions over the semiconductor substrate 101 with the tunnel oxide layer 114 in between. For the reason of simplicity, the field oxide region is not shown. Then, an oxidation process is performed, such that adjacent first polysilicon strip 116 is isolated by a dielectric layer 122. A second polysilicon layer 124 (second floating gate layer) is formed on the first polysilicon layer 116. Then, the interpoly dielectric layer 118 and the control gate layer 120 are formed to accomplish the memory cell. It is well known that a perfect vertical profile control is very difficult to accomplish in the fabrication of semiconductor devices, especially after numbers of oxidation processes have applied. That is in an oxidation process, the portion of polysilicon layer which is close to the surface is usually oxidized faster than the portion that is far from the surface. Thus, due to the anisotropic etch process of the first floating gate layer 116 does not provide ideally anisotropic profile, the vertical profile of the first floating gate strip 116 is only controlled close to ideally formed. Moreover, after the oxidation process of forming the dielectric layer 122 and the interpoly dielectric layer 118 such as ONO layer, the floating gate layer 116 with sloped sidewalls can not be ignored. During the processing of an array with layout similar to that shown in FIG. 1, a problem occurs involving polysilicon stringers due to complex oxidation processes and the non-ideal vertical profile control. If the vertical profile of a floating gate layer is imperfect, when delineating memory cells along a given word line, polysilicon stringers results from anisotropic etching of the floating gate layer. The non-ideal vertical profile causes the reduction of the process tolerance resulting in reliability problem, in other words, resulting in the yield lost.

When portions of the control gate layer 120 is anisotropically etched to define the various word lines for the memory device, portions of floating gate layer between two adjacent word lines (about the source region 110 shown in FIG. 1) is also anisotropically etched away preventing adjacent word lines short together. However, it is well known that anisotropic etch do not repeatedly provide ideally anisotropic profiles, especially the application of oxidation processes makes the control for anisotropic profile of the floating gate layer 116 with sloped sidewalls becoming more difficult. A non-ideal anisotropic etch profile results in remnants of floating gate layer, which are the polysilicon stringers 126, as shown in FIG. 3B. That is to say, when the floating gate layer 116 is sequentially etched, the sloped sidewalls of the floating gate layer 116 is shielded by the dielectric layer 122 resulting in polysilicon stringers 126. As illustrated in FIG. 4, a perspective view of bottom portion of etched region between two word lines is shown. It is clear that the polysilicon stringers 126 pose a substantial reliability problem since the polysilicon stringers 126 in the etched region can short out the word lines in regions 128 and 130, respectively. That is, instead of the etched region electrically isolating the word lines in regions 128 and 130 from one another, the polysilicon stringers 126 span the etched region shielded by the dielectric layer and cause the gates in the regions to be shorted together.

Recently, a floating gate layer of inverted triangle shape has been proposed. However, the etching process of forming an inverted triangle floating gate is more complicated and very difficult to control, and has difficulties in rework through proper in-line monitor process. When the inverted triangle floating gate technique is associated with the application of extra polysilicon floating gate, the formation of a dielectric layer between adjacent inverted triangle floating gates encounters another gap-filling problem. Therefore, there is a strong need to form memory devices without polysilicon stringers and thereby reduce reliability problems due to shorted word lines.

SUMMARY OF THE INVENTION

The present invention is directed toward a method for preventing polysilicon stringer in memory devices. The key aspect of the present invention is the application of a floating gate structure with multi-level oxidation rates the lower portion of the floating gate structure the higher oxidation rates, such as a floating gate structure with two polysilicon layers of different doping concentration or crystallinity the lower polysilicon layer the higher doping concentration, or the lower polysilicon layer the higher crystallinity.

Therefore, in a later oxidation process a desired profile of the polysilicon floating gate structure for etching process is formed, that is from lower portion to higher portion of the floating gate structure an increasing width profile is formed. The width of the upper portion of the floating gate structure is bigger than that of the lower portion of the floating gate structure. Thus, the anisotropic etching process of isolating the word lines maintains an ideal profile control, in other words, the polysilicon stringers in the etched region which short out the word lines is eliminated.

It is another object of this invention that a method for forming a polysilicon structure with an increasing width profile is provided, that is the profile of the upper portion of the polysilicon structure is wider than that of the lower portion of the polysilicon structure.

It is a further object of this invention that a method for forming a multi-layer polysilicon structure to improve the vertical profile control for etching process is provided.

In accordance with the present invention, in one embodiment, a method for preventing polysilicon stringer in memory devices is disclosed. The method comprises the step of forming a conductive structure with a vertical profile on a substrate, wherein the conductive structure has at least two conductive layers having a different oxidation rate arranging from bottom to top on the substrate according to the oxidation rate from higher to lower. Then, an oxidation process such as thermal oxidation process is performed to a portion of the conductive structure, such that the vertical profile of the conductive structure is changed to an increasing width profile from bottom to top, wherein the increasing width profile of the conductive structure helps for etching process control. The step of forming the conductive structure with the vertical profile comprises a step of forming a first conductive layer having a first oxidation rate on the substrate. Then, a second conductive layer having a second oxidation rate is formed on the first conductive layer, wherein the first oxidation rate is greater than the second oxidation rate. Next, a patterned photoresist is formed on the second conductive layer, wherein the patterned photoresist defines the conductive structure. Then, the second conductive layer and the first conductive layer are anisotropically etched to form the conductive structure with the vertical profile by using the patterned photoresist as a mask, and the patterned photoresist is removed. The first conductive layer is a first polysilicon layer with a first doping concentration, and the second conductive layer is a second polysilicon layer with a second doping concentration, wherein the first doping concentration is greater than the second doping concentration. The first conductive layer is a polycrystalline silicon layer, and the second conductive layer is an amorphous silicon layer. The method further comprises a step of etching the conductive structure with the increasing width profile to form a plurality of electrically isolated regions so that formation of conductive stringers is mitigated.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

In one embodiment, a method for preventing ploysilicon stringers in the formation of a memory device is provided. It is well known that the oxidation rate of a ploysilicon layer is varied with the doping concentration or the crystallinity, the higher the doping concentration the higher the oxidation rate or the higher the crystallinity the higher the oxidation rate. Therefore, a polysilicon structure with multi-level oxidation rates such as a floating gate structure with two polysilicon layers of different doping concentration or crystallinity arranged in a stack structure from bottom to top according to the oxidation rates from higher to lower can form a desired profile for etching processes after an oxidation process is performed. That is to say, an increasing width profile from bottom to top of a floating gate structure is provided for an anisotropic etching process of isolating the word lines that maintains an ideal etching result, thus the polysilicon stringers in the etched region which short out the word lines is eliminated.

Figure 1:
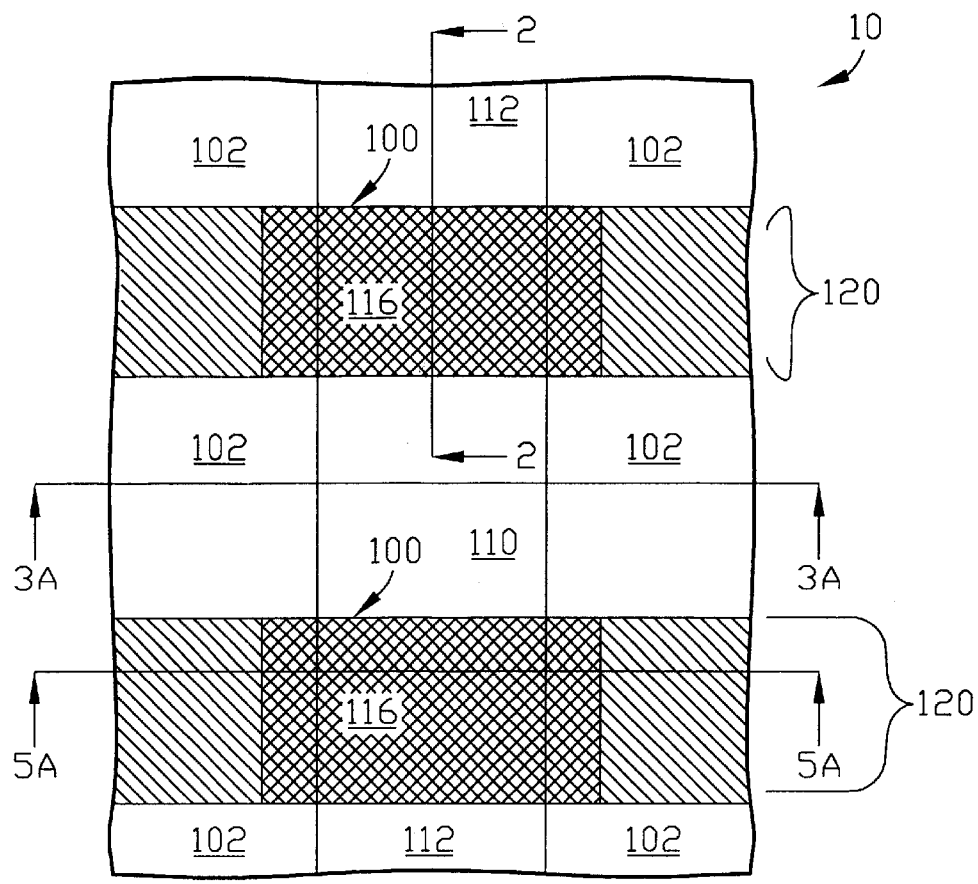
FIG. 1 is a top view of a portion of a memory array.
Figure 2:
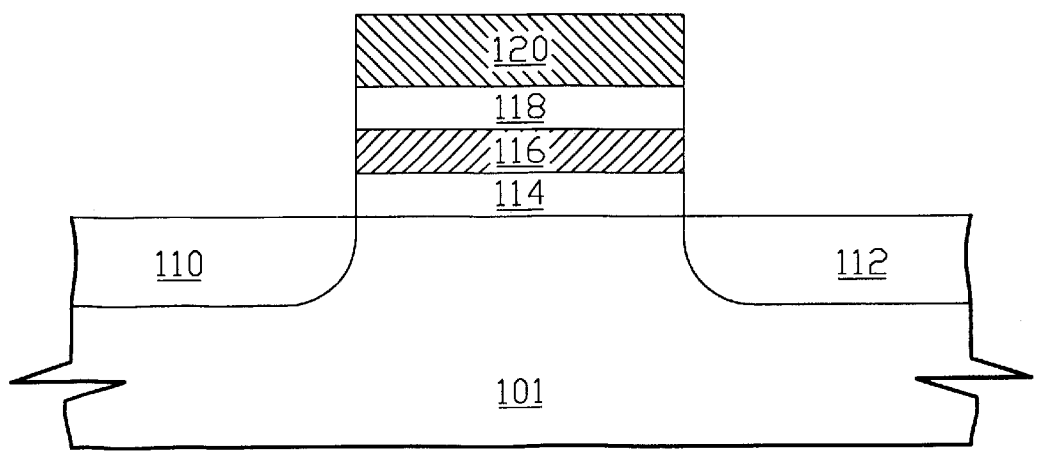
FIG. 2 is a schematic cross-sectional view taken along cutting line I—I in FIG. 1.
Figure 3A:
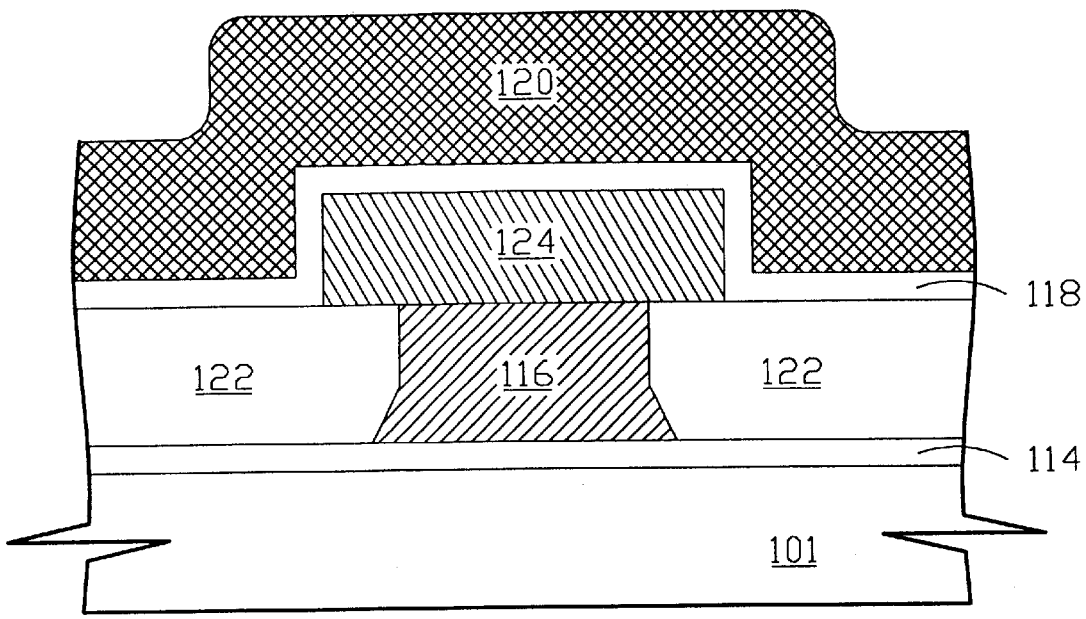
FIGS. 3A to 3B is a schematic cross-sectional view of a flash memory cell with enhanced floating gate structure taken along a cutting line similar to 3—3 in FIG. 1 in the process of fabricating a word line by the prior art technique.
Figure 3B:
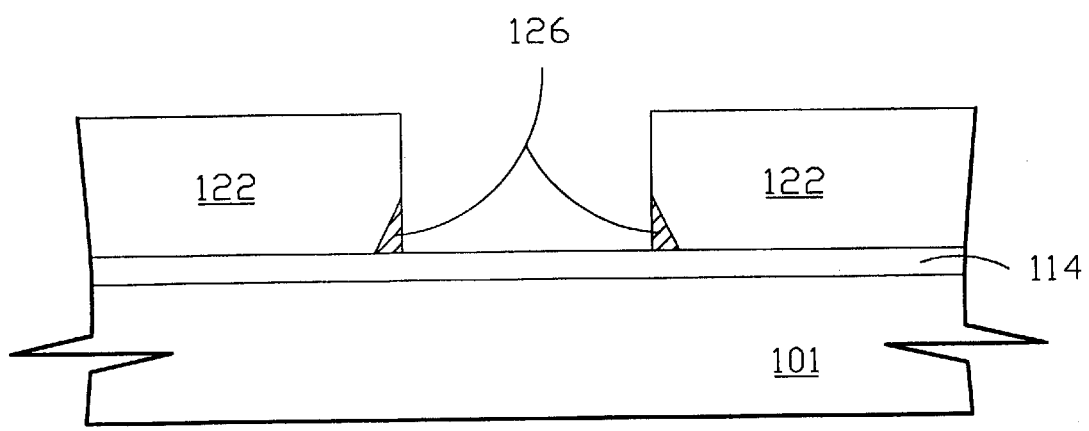
Figure 4:
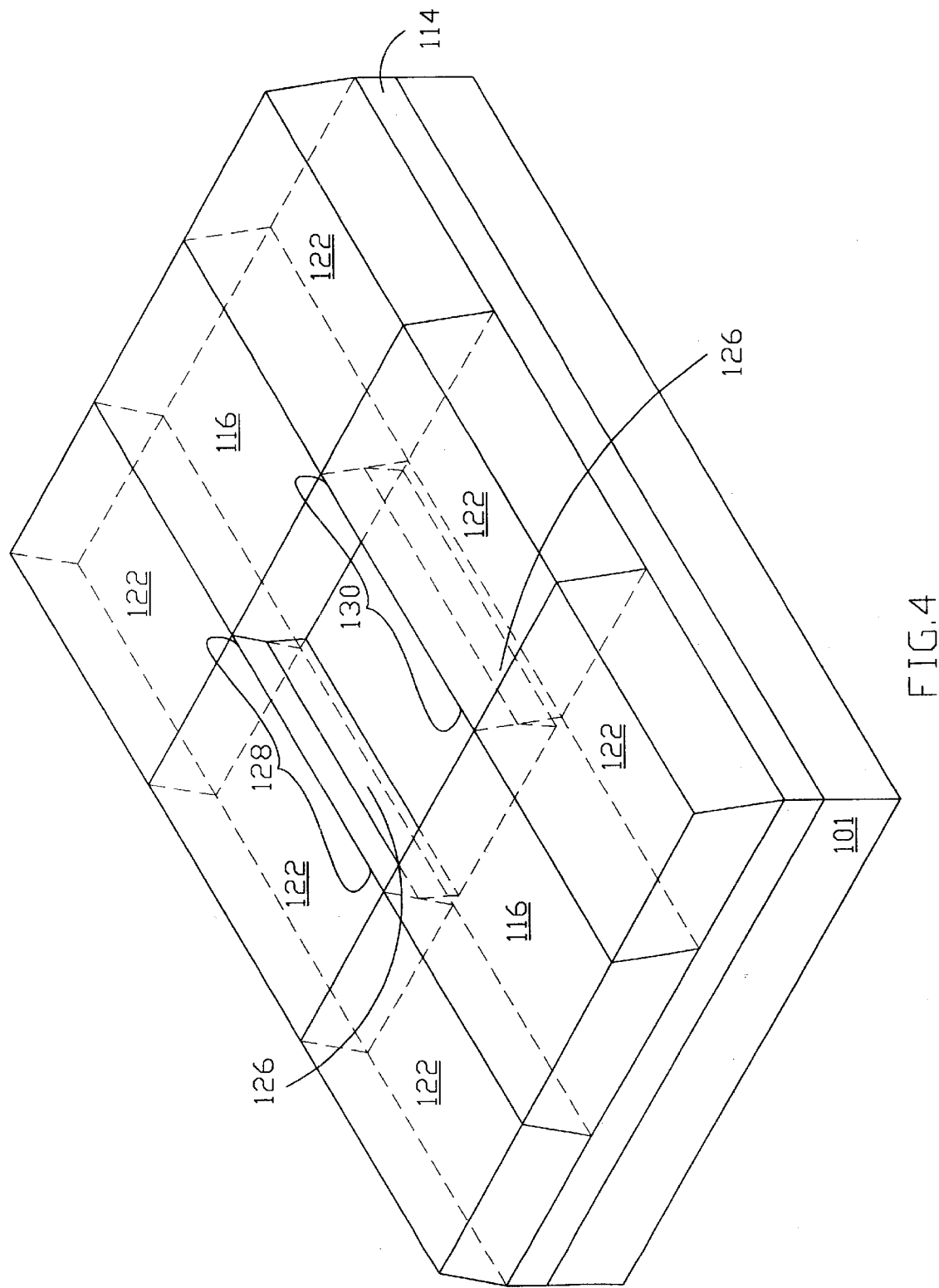
FIG. 4 is a perspective view of bottom portion of etched region between two word lines showing the formation of polysilicon stringers resulting in shorted word lines.

The method according to the aspect of the present invention will be described in conjunction with FIGS. 5A to 5F. It is noted that the cross-sectional view shown in FIG. 5A to 5F is in a direction similar to that shown in FIG. 3. The manufacture of a flash memory cell similar to FIG. 3 begins with the formation of field oxide regions in a semiconductor substrate such as a silicon substrate. The field oxide region can be formed either by a local oxidation (LOCOS) process or a shallow trench isolation (STI) process. Referring to 5A, after the formation of the field oxide region (not shown), a thin tunnel oxide layer 210 is formed over the silicon substrate 201 using a thermal growth process. Then, the key step of the present invention, the formation of a floating gate structure with multi-level oxidation rates for word line isolation etching process is followed.

A first conductive layer 212 with a first oxidation rate is formed on the tunnel oxide layer 210. Then, a second conductive layer 214 with a second oxidation rate is formed on the first conductive layer 212, wherein the first oxidation rate is greater than the second oxidation rate. The conductive layers such as polysilicon layers 212, 214 can be formed by, for example, low pressure chemical vapor deposition (LPCVD) and doped via, for example, diffusion doping or ion implantation doping techniques to create different doping concentration or crystalline characteristic. For example, in one embodiment, the first conductive layer can be a first polysilicon layer 212 with a first doping concentration, and the second conductive layer can be a second polysilicon layer 214 with a second doping concentration, wherein the first doping concentration is higher than the second doping concentration. That is the first polysilicon layer 212 is formed with gas dopants such as PH3 (phosphine), then the dopant gas is turned off to formed the second polysilicon layer 214, which is undoped. Additionally, in other embodiment, the first conductive layer can be a polycrystalline silicon layer 212, and the second conductive layer is the amorphous silicon layer 214. For example, the polycrystalline silicon layer 212 is formed at a higher temperature, then the amorphous silicon layer 214 is formed at a lower temperature.

Figure 5A:
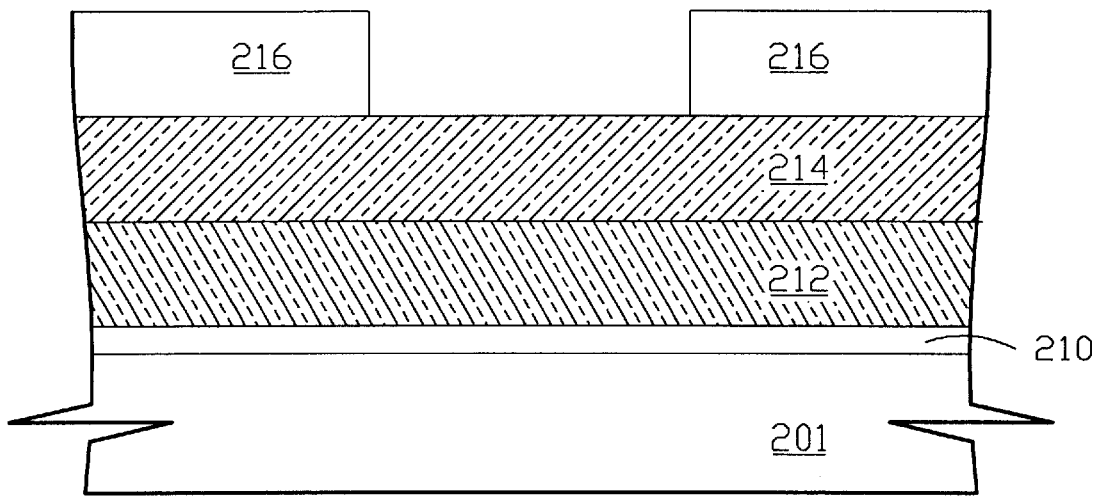
FIGS. 5A to 5F is a schematic cross-sectional view of a flash memory cell with enhanced floating gate structure in the process of forming a flash memory device without polysilicon stringers in accordance with the present invention.
Figure 5B:
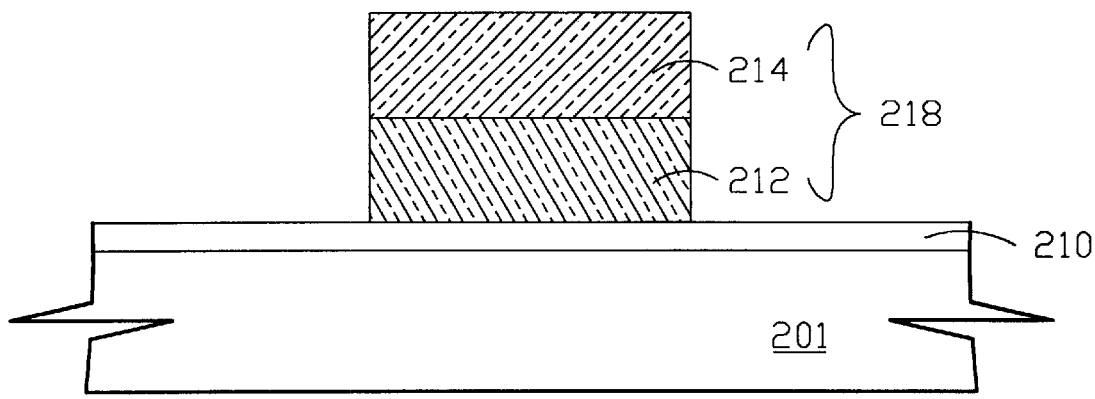

Subsequent to the formation of the polysilicon layers 212, 214, the two polysilicon layers are approximately ideally anisotropic etched to form an electrically isolated region (a first floating gate layer or conductive structure) 218, as illustrated in FIG. 5B. The etching step of the two polysilicon layers is accomplished by forming a first patterned photoresist which defines the conductive structure 218 and acts as an etch mask 216, then the first patterned photoresist 216 is removed after the etching process. In another embodiment, the step of forming the first floating gate layer (conductive structure) 218 comprises forming a polysilicon layer, then the polysilicon layer is implanted with a first doping concentration. A thermal process is performed to drive the dopants into the lower portion of the polysilicon layer. Next, the polysilicon layer is again implanted with a second doping concentration, which is lower than the first doping concentration. Thus, after the pattern transferring process the floating gate structure is formed with multi-level oxidation rates, the lower portion the higher oxidation rate.

Figure 5C:
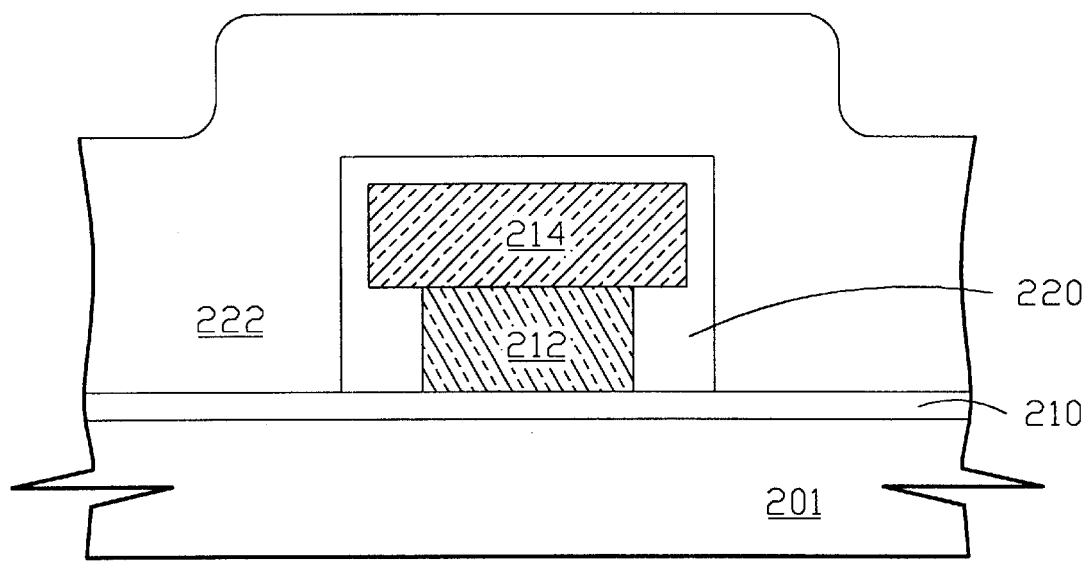
Figure 5D:
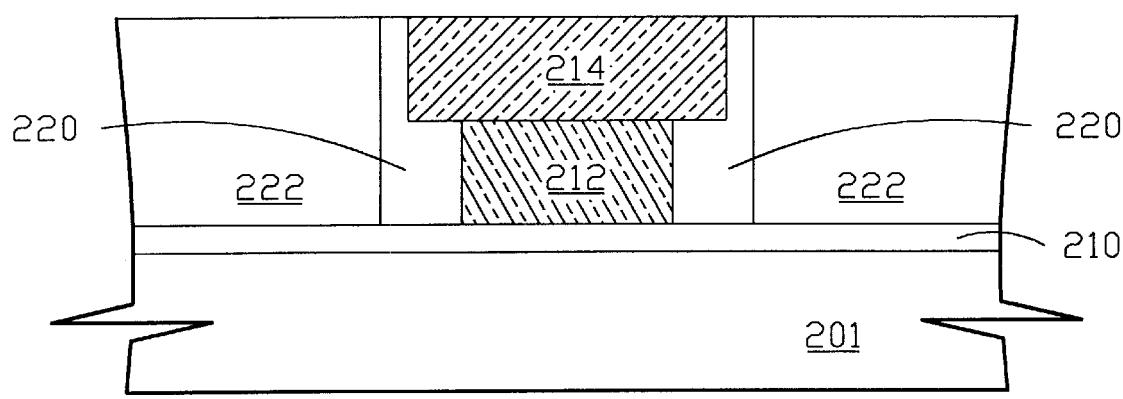

Then, an oxidation process such as thermal oxidation process, is performed to form a liner oxide layer 220 on the conductive structure 218, such that the vertical profile of the dual polysilicon layer 218 (the first floating gate layer) is changed to an increasing width profile from bottom to top (such as torch shape). In other words, due to the difference in oxidation rate, the lateral oxidation happens in the first polysilicon layer 212 is faster than that in the second polysilicon layer 214 resulting in the width of the second polysilicon layer 214 wider than that of the first polysilicon layer 212. An insulating layer 222 such as a silicon oxide layer is formed over the silicon substrate 201 for the purpose of electrically isolating adjacent first floating gate layers 218, as shown in FIG. 5C. The formation of the silicon oxide layer 222 can be done by, for example, high density plasma oxidation and low pressure TEOS (tetra-ethyl orthosilicate) or 03 (ozone)-TEOS. Then, the silicon oxide layer 222 is planarized to expose the first floating gate layer 218, as shown in FIG. 5D. The planarization is achieved by, for example, chemical mechanical polishing or etch-back process.

Figure 5E:
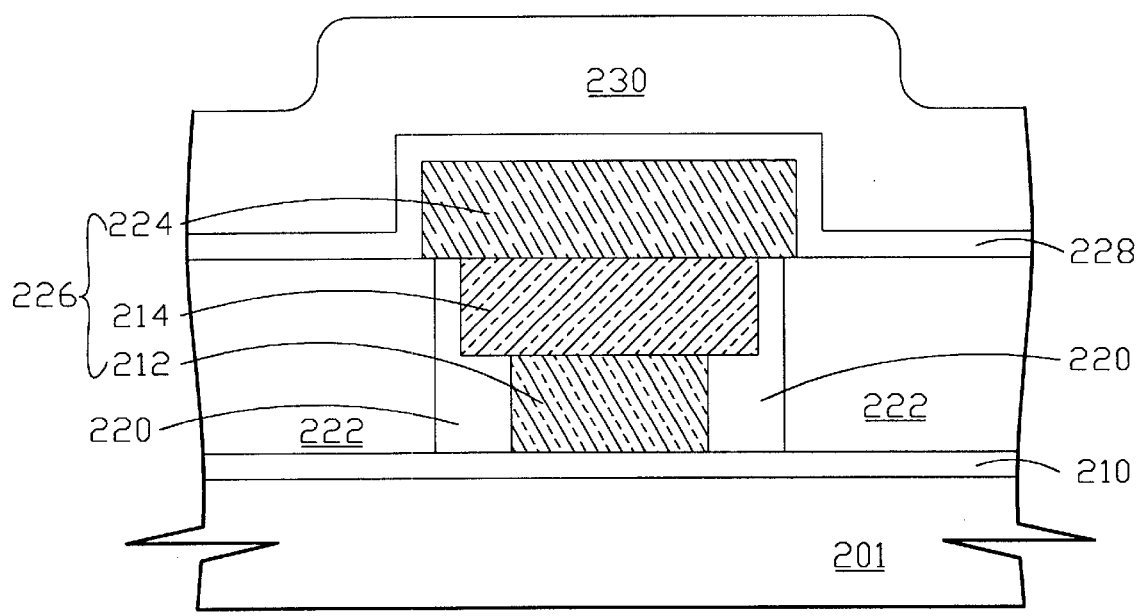

Referring to FIG. 5E, for the purpose of increasing coupling ratio, a third conductive layer 224 such as a third polysilicon layer is formed on the silicon oxide layer 222 with isolated polysilicon structure 218 to improve the surface of the floating gate. Then, the third polysilicon layer 224 is etched to form an electrically isolated region (a second floating gate layer) 224, which covers the isolated dual polysilcion structure 218. The etching step of the third polysilicon layer 224 is accomplished by forming a second patterned photoresist (not shown) which defines the second floating gate layer 224 and acts as an etch mask, then the second patterned photoresist is removed after the etching process. Thus, a floating gate structure 226 having a polysilicon layer 224 of improved surface area and a dual polysilicon structure 218 (the first floating gate layer) with increasing width profile is formed. Then, an interploy dielectric layer 228 is then formed on the third polysilicon layer 224. The interpoly dielectric 228 layer is preferably a three-layer region of oxide/nitride/oxide (ONO) and overlies the entire surface of the silicon substrate 201. Then, a control gate layer 230 such as a fourth polysilicon layer is formed on the ONO layer 228 to accomplish the stack of flash memory cell.

Figure 5F:
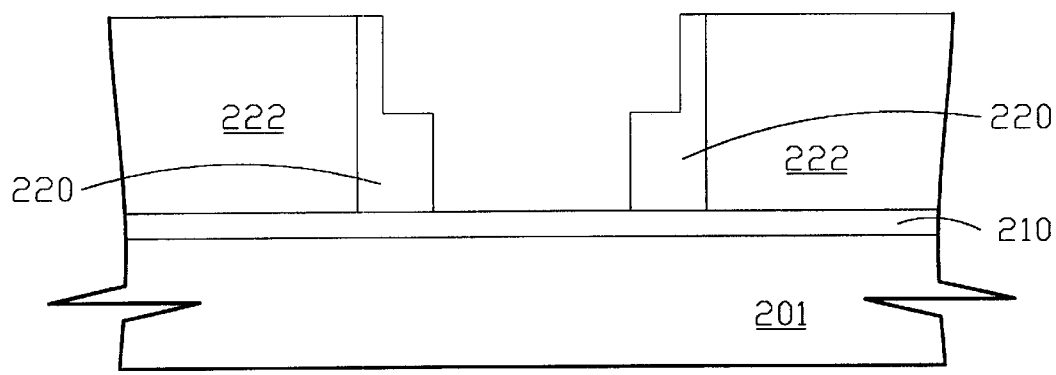

After the control gate layer 230 is formed, a plurality of word lines for the memory cells are defined by a self-aligned etching (SAE) process due to the high selectivity between polysilicon layer and oxide layer. The etching process is achieved by forming a third patterned photoresist (not shown) which defines the word lines on the control gate layer 230 and acts as an etching barrier, and the third patterned photoresist is removed after the etching process. The regions of floating gate structure 226 between adjacent word lines are also anisotropically etched away. In the anisotropic etching process of isolating the word lines, due to the increasing width profile of the first floating gate layer 218, using the second polysilicon layer 214 of wider width to control the etching parameters generates an ideal etching result, as shown in FIG. 5F. In other words, the polysilicon stringers in the etched region which short out the word lines is eliminated due to the formation of the floating gate structure with multilevel oxidation rates resulting in the increasing width profile.

Although specific embodiments have been illustrated and described, it will be obvious to those skilled in the art that various modifications may be made without departing from what is intended to be limited solely by the appended claims.

What is claimed is:

1. A method for preventing conductive stringer in memory device, said method comprising:

forming a conductive structure with a vertical profile on a substrate, wherein said conductive structure has at least two level oxidation rates, lower portion of said conductive structure higher said oxidation rates;

performing an oxidation process to a portion of said conductive structure, such that said vertical profile of said conductive structure is changed to an increasing width profile from lower to higher portion of said conductive structure, wherein said increasing width profile of said conductive structure helps for etching process control; and etching said conductive structure with said increasing width profile to form a plurality of electrically isolated regions without any conductive stringers.

2. The method according to claim 1, wherein said conductive structure comprises a first conductive layer with a first oxidation rate and a second conductive layer with a second oxidation rate, wherein said first oxidation rate is greater than said second oxidation rate.

3. The method according to claim 2, wherein said step of forming said conductive structure with said vertical profile comprises:

forming said first conductive layer having said first oxidation rate on said substrate;

forming said second conductive layer having said second oxidation rate on said first conductive layer, wherein said first oxidation rate is greater than said second oxidation rate;

forming a first patterned photoresist on said second conductive layer, wherein said first patterned photoresist defines said conductive structure;

anisotropically etching said second conductive layer and said first conductive layer to form said conductive structure with said vertical profile by using said first patterned photoresist as a mask; and removing said first patterned photoresist.

4. The method according to claim 3, wherein said first conductive layer is a first polysilicon layer with a first doping concentration.

5. The method according to claim 4, wherein said second conductive layer is a second polysilicon layer with a second doping concentration, wherein said first doping concentration is greater than said second doping concentration.

6. The method according to claim 3, wherein said first conductive layer is a polycrystalline silicon layer.

7. The method according to claim 6, wherein said second conductive layer is an amorphous silicon layer.

8. The method according claim 1, wherein said step of performing said oxidation process comprises performing a thermal oxidation process to said portion of said conductive structure.

9. A method of preventing polysilicon stringers in a memory device, said method comprising:

forming a conductive structure with a vertical profile on a substrate, wherein said conductive structure has at least two conductive layers having a different oxidation rate arranging from bottom to top on said substrate according to said oxidation rate from higher to lower;

performing an oxidation process to a portion of said conductive structure, such that said vertical profile of said conductive structure is changed to an increasing width profile from bottom to top, wherein said increasing width profile of said conductive structure helps for etching process control; and etching said conductive structure with said increasing width profile to form a plurality of electrically isolated regions without any conductive stringers.

10. The method according to claim 9, wherein said step of forming said conductive structure comprises:

forming a first polysilicon layer with a first doping concentration on said substrate;

forming a second polysilicon layer with a second doping concentration on said first polysilicon layer, wherein said first doping concentration is greater than said second doping concentration;

forming a first patterned photoresist on said second polysilicon layer, wherein said first patterned photoresist defines a conductive structure;

anisotropically etching said second polysilicon layer and said first polysilicon layer to form said conductive structure with a vertical profile by using said first patterned photoresist as a mask; and removing said first patterned photoresist.

11. The method according to claim 9, wherein said step of forming said conductive structure comprises:

forming a polycrystalline silicon layer on said substrate;

forming an amorphous silicon layer on said polycrystalline silicon layer;

forming a second patterned photoresist on said amorphous silicon layer, wherein said second patterned photoresist defines a conductive structure;

anisotropically etching said amorphous silicon layer and said polycrystalline silicon layer to form said conductive structure with a vertical profile by using said second patterned photoresist as a mask; and removing said second patterned photoresist.

* * * * *